United States Patent [19]

Lee et al.

[11] Patent Number: 4,639,615

[45] Date of Patent: Jan. 27, 1987

[54] TRIMMABLE LOADING ELEMENTS TO CONTROL CLOCK SKEW

[75] Inventors: Charles M. Lee, New Providence; Bernard T. Murphy, Summit, both of N.J.

[73] Assignee: AT&T Bell Laboratories, Murray Hill, N.J.

[21] Appl. No.: 566,154

[22] Filed: Dec. 28, 1983

[51] Int. Cl.⁴ ................ H03K 19/096; H03K 19/003; H03K 5/13; H03K 5/26

[52] U.S. Cl. .................... 307/269; 307/202.1; 307/443; 307/451; 307/480; 307/601; 307/602; 307/603; 307/605; 371/1

[58] Field of Search ............... 307/202.1, 443, 448, 307/451, 475, 465, 468, 469, 591, 592, 594, 595, 597, 601, 602, 603, 605, 606, 268, 269, 296 R, 297, 270, 244, 577, 585, 480–481; 365/200; 371/1

[56] References Cited

U.S. PATENT DOCUMENTS

| | | | |
|---|---|---|---|
| 4,016,483 | 4/1977 | Rudin | 307/303 X |
| 4,100,437 | 7/1978 | Hoff, Jr. | 307/297 |
| 4,122,995 | 10/1978 | Franke | 371/1 |
| 4,228,528 | 7/1983 | Cenker et al. | 365/200 |
| 4,424,456 | 1/1984 | Shiraki et al. | 307/475 X |
| 4,479,216 | 10/1984 | Krambeck et al. | 371/61 |
| 4,499,387 | 2/1985 | Konishi | 307/451 X |
| 4,507,576 | 3/1985 | McCracken et al. | 307/443 X |
| 4,508,983 | 4/1985 | Allgood et al. | 307/577 |
| 4,516,312 | 5/1985 | Tomita | 29/571 |
| 4,542,505 | 9/1985 | Binoeder et al. | 371/1 |
| 4,550,405 | 10/1985 | West | 371/1 |

Primary Examiner—Larry N. Anagnos
Attorney, Agent, or Firm—James H. Fox

[57] ABSTRACT

An integrated circuit chip in which clock pulses are distributed to a plurality of circuits includes a pattern of trimmable elements such as capacitors or transistors. The capacitors or transistors are trimmed during manufacture in order, for example, to adjust clock skew.

12 Claims, 7 Drawing Figures

TRIMMABLE LOADING ELEMENTS TO CONTROL CLOCK SKEW

FIELD OF THE INVENTION

This invention relates to semiconductor integrated circuit chips and, more particularly, to such chips in which clock pulses are distributed to a number of logic circuits located at various positions in a chip or to a number of chips in a chip set.

BACKGROUND OF THE INVENTION

Integrated circuit chips are well known in the art. The microprocessor chip is, perhaps, the most familiar of these chips and the invention, accordingly, will be described in terms of such a chip.

A microprocessor is characterized by a datapath in which various mathematical operations are executed. The operations typically are carried out by the manipulation of data stored in memory frequently external to the chip. The data in memory is identified and moved to on-chip storage areas in accordance with instructions also stored in external memory. The instructions are applied to an instruction register often for inputting, for example, to a programmable logic array (PLA). The PLA, in turn, outputs sequences of microcode (machine instructions) for manipulating the elements of the datapath.

Transmission of data between various elements of the microprocessor is by multiple conductors arranged in bus structures as is well understood. The bus over which data moves in the microprocessor is called the databus. The databus outputs signals via an input/output (I/O) interface which frequently takes the form of a frame about the edge of the chip.

The I/O frame includes a number of (high capacitance) circuits operative to shape outputs from the databus so that the signals are useful for driving external circuitry. Such a circuit may include, for example, a plurality of inverters connected, electrically in series, between the databus output and a pad to which external connection may be made. The circuits in the I/O frame are clocked by pulses on clock distribution lines as are the control, logic and datapath elements in the microprocessor. It has been found to be difficult to avoid clock skew in the circuits of the I/O frame. Consequently, the throughput of microprocessors is relatively limited to the extent that skew is not reduced.

BRIEF DESCRIPTION OF THE ILLUSTRATIVE EMBODIMENT

Clock skew in the circuits of the I/O frame is reduced by adding an arrangement of trimmable elements between the input node to such a circuit and the substrate (ground) of the chip. The elements in one embodiment are metallized areas which form a plurality of capacitors on the face of the chip interconnected by metallic links. Each such area is separated from the chip substrate by a dielectric (oxide) layer thus forming the requisite plurality of capacitive elements with the underlying substrate. Additional electrical conductors are attached to the links and to test pads to which external connections can be made during testing. The elements illustratively have values (capacitance) tailored according to the algorithm $2^0, 2^1, 2^2 \ldots$. Voltages are applied to the additional conductors to evaporate selected links thus adjusting the capacitance of each circuit. Clock skew can be reduced in this manner to less than 1 nanosecond.

Alternatively, the additional electrical conductors may be omitted and the links evaporated via a laser.

In still a further embodiment, trimmable elements are attached at the output of an I/O circuit such as an inverter chain. In this type of embodiment, links are evaporated as described above to alter the pull-up times of outputs from the chips.

An alternative way to control the clock skew is to trim the driving transistor's size. In this embodiment, the driving transistor is constructed by connecting a number of transistors electrically in parallel. The sizes of these transistors are $2^0, 2^1, 2^2, 2^3 \ldots$ (1, 2, 4, 8, etc.), times some basic unit. The capacitive load is kept fixed.

Each transistor has a fusible link connected in series with it. These fusible links can be evaporated by a laser beam or by an electric current. Once the initial clock skew is measured, the test machine is programmed to carry out some calculation and a decision is made by the test machine to remove one or a number of transistors from the driving gate. The number of transistors used and the basic transistor size are chosen based on the dynamic range and resolution desired.

DETAILED DESCRIPTION

Figure 1:
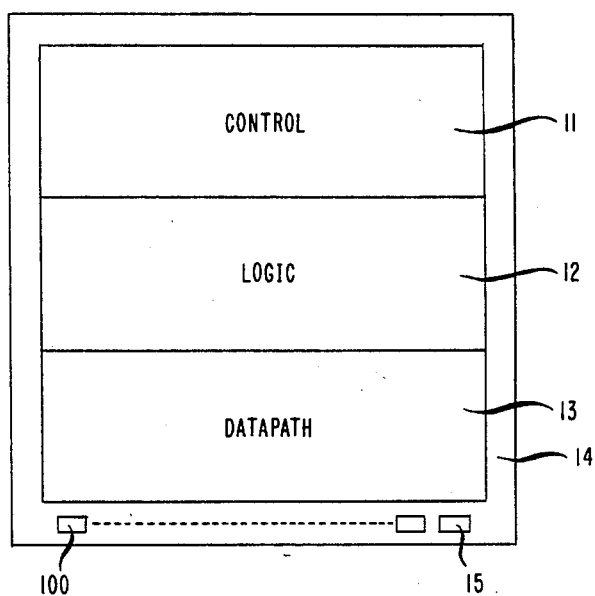
FIG. 1 is a schematic representation of a semiconductor IC including I/O circuits with trimmable elements in accordance with this invention.

FIG. 1 shows a semiconductor IC 10 including familiar control, logic, and datapath portions 11, 12, and 13, respectively, characteristic of a microprocessor organization. The microprocessor also includes an I/O frame 14.

Figure 2:
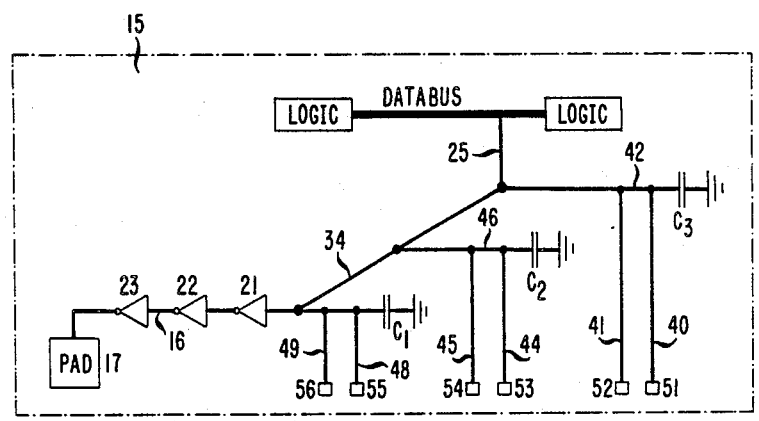
FIGS. 2, 5 and 7 are circuit diagrams of portions of alternative circuits useful in the arrangement of FIG. 1.

The datapath of the microprocesor includes a databus to which outputs are applied during normal operation for transmission to external circuitry. Such outputs are adjusted in shape by an output circuit 15 including, typically, a chain of inverting amplifiers each having a gain of one. The chain is operative to delay and sometimes invert the output as well. The so-manipulated output appears at a pad to which external utilization circuitry may be connected. FIG. 2 shows a representative chain 16 of inverters between the databus and a pad 17. The inverters are designated 21, 22 and 23.

A plurality of capacitors $C_1$, $C_2$, and $C_3$ is connected to node 34. The capacitors comprise a plurality of rectangular metallic (or polysilicon) islands. FIG. 2 shows, enlarged, the circuit diagram of the capacitors. Note from FIG. 2 that the connection between each capacitor, $C_1$, $C_2$, and $C_3$, and node 34 is, itself, connected to externally accessible pads. Specifically, conductors 40 and 41 connected lead 42. Similarly, conductors 44 and 45 connect lead 46, and conductors 48 and 49 connect lead 50. The conductors are brought out to pads 51, 52, 53, 54, 55 and 56 (which may be merged into two pads in practice).

Figure 3:
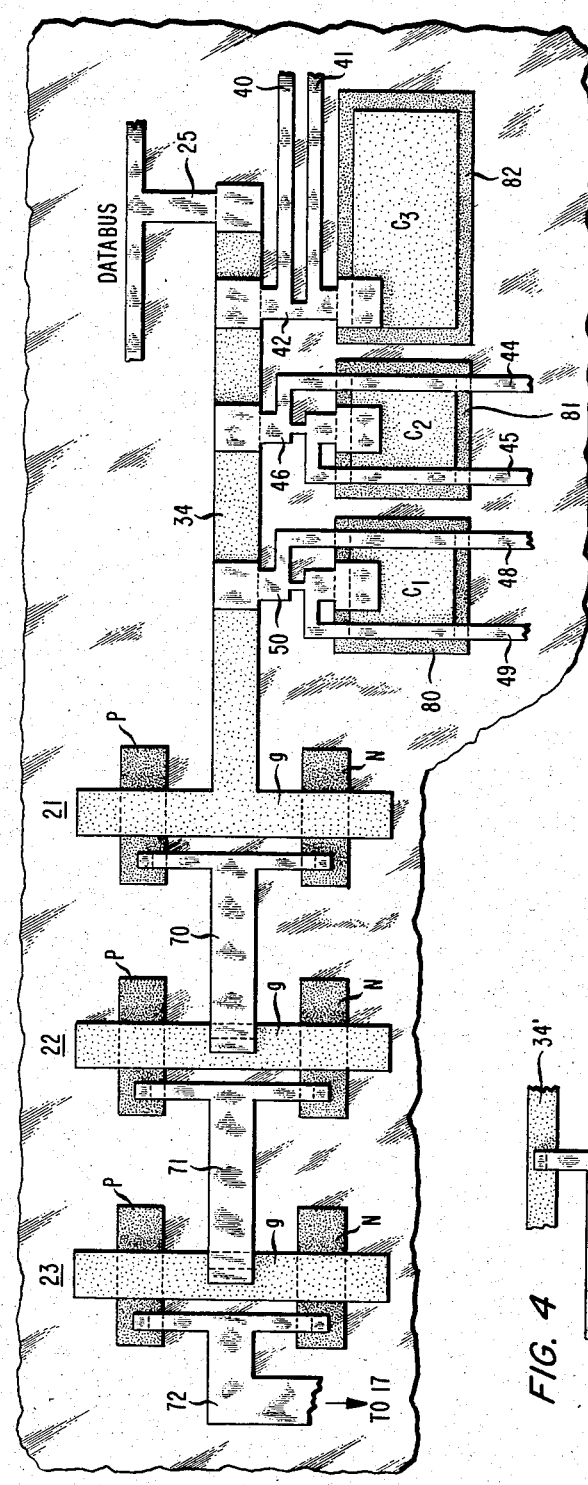
FIGS. 3 and 4 are enlarged top views of portions of an implementation of the circuit of FIG. 2; and, FIG. 6 is a graph depicting the changed operation characteristic of the circuit of FIG. 5.

The circuit is implemented in CMOS technology by a series of diffusions and depositions on the surface of a semiconductor chip. FIG. 3 shows a fragment of such a chip 60. The databus and the input 25 to the circuit of FIG. 2 connect through a through-connection to node 34. The databus and the input (25) are formed in the aluminum level and 34 is formed in the polysilicon level of the circuit. The two levels are separated by an oxide level penetrated by the through-connection.

The three amplifiers 21, 22, and 23 are implemented in the traditional way with N type and P type field effect transistors (FET) formed by reducing the thickness of the oxide in selected positions (thinox) as is well known. These areas are designated P and N, as shown in FIG. 3.

Associated P and N areas are interconnected by a gate defined in the polysilicon level. The gates are designated g. Associated P and N areas are connected to the gate of the adjacent amplifier by connections 70 and 71 in FIG. 3. These connections are defined in the aluminum level. The connection 72 to pad 17 also is defined in the aluminum level and is common to the P and N areas of transistor 23, as shown.

The capacitors are connected to node 34 by leads 42, 46 and 50 as stated hereinbefore. These leads are defined in the aluminum level as are connections 40, 41, 44, 45, 48 and 49. The capacitors are defined illustratively in the polysilicon level on top of thinox areas 80, 81, and 82. The capacitors are connected through the substrate of chip 60 to a reference voltage generally accepted to be ground.

The area of a capacitor ($C_1$, $C_2$, or $C_3$) is one parameter useful to determine the capacitance. It has been found convenient for the areas to be chosen proportional to $2^0, 2^1, 2^2, 2^3 \ldots$ (1, 2, 4, 8 ...) in order to permit fine adjustment of skew in the various circuits of the I/O. In practice, such circuits normally are designed to limit skew to ±1.0 nanoseconds. But processing variations introduce a spread of about ±3 nanoseconds. It is this spread to which the present invention is directed and results in a variation maintained to within about 1 nanosecond.

Figure 4:
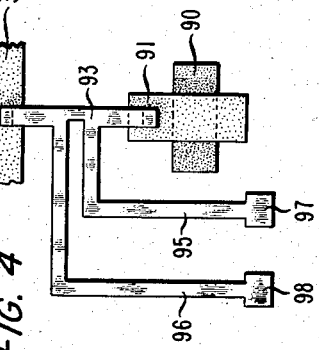

As is well known, capacitance may be introduced in the form of a transistor. FIG. 4, for example, shows a transistor with an N type FET 90 having a gate connection (polysilicon level) indicated at 91. The lead 93 to node 34' is connected to two conductors 95 and 96. The conductors terminate at pads 97 and 98.

The pads 51–56 of FIG. 2 and 97 and 98 of FIG. 4 are utilized during testing to evaporate links to previously connected elements. In this manner the skew determined at pad 17 is adjusted with respect to skew determined at other output pads. If skew at pad 17 in the circuit of FIG. 1 differs from, say the output pad of circuit 100, of FIG. 1, voltages are applied to the pads to send current through leads 42, 46 and/or 50 (FIG. 3) to evaporate at least portions of those leads. Typically, each of those leads is made with a relatively narrow portion as shown in FIG. 3 so that it acts as a fuse. The result is to change the effective capacitance at node 34 and thus to change clock skew in the effected circuit. The relationship between skew and capacitance is found by circuit simulation or by calibration measurement for a small number of samples on a test machine.

The arrangement of capacitors is useful primarily where circuit design already necessitates the presence of substantial capacitance by virtue of the presence of a chain of amplifiers. But node 34 is not necessarily the only place where trimmable capacitors can be added to advantage.

Figure 5:
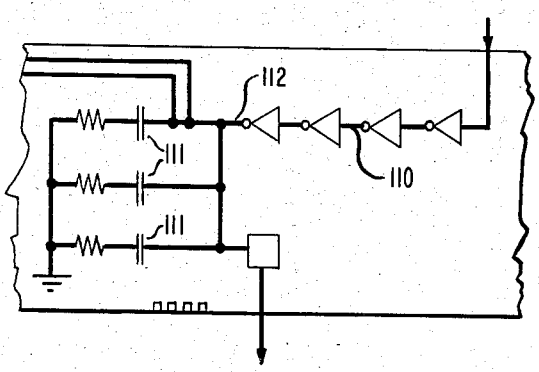
Figure 6:
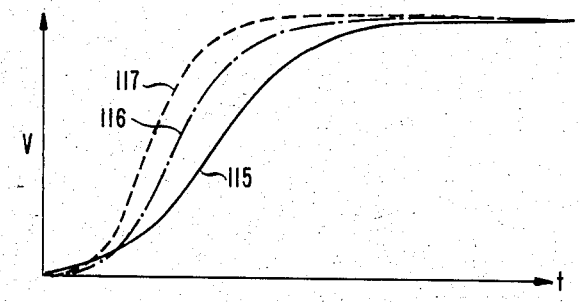

FIG. 5 shows a circuit arrangement where a chain of amplifiers 110 is connected to a pattern of trimmable capacitors 111 at its output node 112. Trimming capacitors at such an output node to reduce capacitance there results in a change in the slope of the output pulse from 115 to 116 to 117 as capacitance increases, as shown in FIG. 6.

Figure 7:
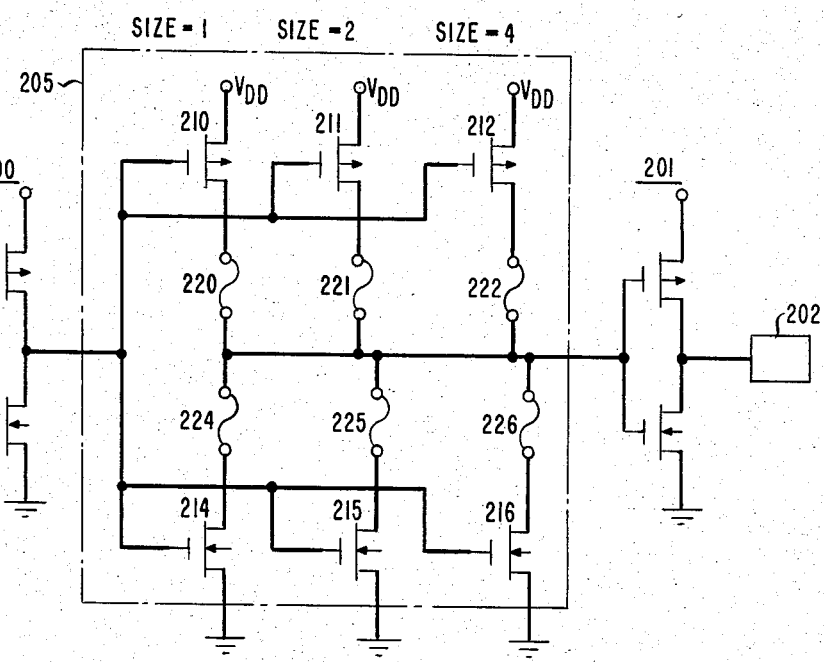

FIG. 7 shows an alternative arrangement employing trimmable transistors instead of trimmable capacitors. The arrangement includes a series of inverters from a first 200, at an internal node, to a last 201, adjacent a pad 202 for external connection. Inverters 200 and 201 correspond to, for example, inverters 21 and 23 of FIGS. 1 and 2. But the network 205 of FIG. 7 replaces inverter.

Network 205 comprises three PFETS, 210, 211, and 212 at the top as viewed and three NFETS 214, 215 and 216 at the bottom. The drains of associated P and NFETS are connected to common nodes via fusible links 220, 221, and 222 and 224, 225 and 226 as shown. The common nodes between the fusible links are connected electrically to one another and to the gates of the transistor of inverter 201. The gates of all six transistors are connected to the drains of the transistors of inverter 200. The sizes of the P as well as the NFETS varies proportionally as $2^0, 2^1, 2^2, 2^3$ as indicated to provide fine adjustment of 16 steps.

Note that associated transistors of network 205 along with their associated fuses are connected between $V_{DD}$ and a reference voltage (viz: ground).

The invention has been described in terms of leads which are evaporated selectively during a test operation in order to trim capacitance load, or to trim the driving transistors at a selected location. Such an operation requires additional conductors and pads which are accessible from the outside. The conductors and pads occupy a certain amount of chip surface area to be about 0.3 mm² for a typical circuit, as shown in FIG. 2. Such an area normally is available because the I/O portion 14 of FIG. 1 normally has excess space. Alternatively, the capacitors can be trimmed by laser trimming techniques which require relatively little of the extra chip area.

A trimmable arrangement also is useful in trimming clock pulse propagation delays from a clock chip so that outputs from the clock generator circuits of the chip (driving 75 picafarads) track to within 1 nanosecond or so.

What is claimed is:
1. A semiconductor integrated circuit comprising:
clock means for generating clock pulses;
first and second logic circuits each having an output node and controlled by said clock means;
means for coupling clock pulses from said clock means to a first node connected to said first logic circuit;
and means for coupling clock pulses from said clock means to a second node connected to said second logic circuit,
characterized in that
said integrated circuit further comprises at least one trimmable element connected to said first node and adapted to adjusting the skew of the clock pulses developed at said first logic circuit output node with respect to the clock pulses at said second logic circuit output node.

2. The integrated circuit of claim 1 wherein said first logic circuit comprises an output circuit connected between said first node and a first output of said integrated circuit, and said second logic circuit comprises an output circuit connected between said second node and a second output of said integrated circuit.

3. The integrated circuit of claim 2 wherein said first and second output circuits each comprise a plurality of cascade-connected inverting amplifiers.

4. The integrated circuit of claim 1 wherein said at least one trimmable element comprises a p-channel field effect transistor and an n-channel field effect transistor having their gates connected together, their sources connected to power supply voltage means, and their drains connected together through fusible leads.

5. The integrated circuit of claim 1 further comprising a databus and a plurality of external pads, one for each bit of the databus, whereby trimming the trimmable element connected to said first node minimizes the amount of clock skew between at least two of said bits at said external pads.

6. The integrated circuit of claim 1 wherein said at least one trimmable element is connected between said first node and a source of electrical potential on said integrated circuit.

7. The integrated circuit of claim 1 wherein said at least one trimmable element is a capacitor.

8. The integrated circuit of claim 1 wherein said at least one trimmable element is a capacitor having a fusible lead connected thereto.

9. The integrated circuit of claim 1 wherein said at least one trimmable element is plurality of capacitors having capacitance values proportional to $2^0, 2^1, 2^2 \ldots$ 10. The integrated circuit of claim 1 wherein said at least one trimmable element is adapted to being trimmed by means of a fusible lead connected thereto.

11. The integrated circuit of claim 1 wherein said fusible lead is adapted to being opened by the application of an electrical current thereto.

12. The integrated circuit of claim 10 wherein said fusible lead is adapted to being opened by the application of a laser thereto.

* * * * *